United States Patent [19]

Fujii et al.

[11] Patent Number: 5,547,899
[45] Date of Patent: Aug. 20, 1996

[54] METHOD FOR MAKING A SEMICONDUCTOR DEVICE

[75] Inventors: Nariaki Fujii; Tatsuya Kimura, both of Hyogo, Japan

[73] Assignee: Mitsubishi Denki Kabushiki Kaisha, Tokyo, Japan

[21] Appl. No.: 401,980

[22] Filed: Mar. 10, 1995

[30] Foreign Application Priority Data

Sep. 26, 1994 [JP] Japan .................................. 6-229500

[51] Int. Cl.⁶ ................................................ H01L 21/22
[52] U.S. Cl. ......................... 437/151; 437/152; 437/167; 437/129; 437/133
[58] Field of Search ................................ 437/151, 152, 437/167, 129, 133

[56] References Cited

U.S. PATENT DOCUMENTS

| | | | |
|---|---|---|---|
| 4,183,038 | 1/1980 | Namizaki et al. | 437/167 |
| 4,213,808 | 7/1980 | Thompson et al. | 437/167 |
| 4,233,090 | 11/1980 | Hawrylo et al. | 437/167 |
| 4,660,208 | 4/1987 | Johnston, Jr. et al. | 372/46 |
| 5,290,730 | 3/1994 | McFarlane et al. | 437/151 |
| 5,306,950 | 4/1994 | Fujikawa et al. | 257/750 |

FOREIGN PATENT DOCUMENTS 62-291084  12/1987  Japan .
669595  3/1994  Japan .

OTHER PUBLICATIONS

Kazmierski et al, "Universal Iron Behaviour In Zn—, Cd— And Be—Doped P–Type InP", Journal of Crystal Growth, vol. 116, 1992, pp. 75–80.

*Primary Examiner*—R. Bruce Breneman
*Assistant Examiner*—Ramamohan Rao Paladugu
*Attorney, Agent, or Firm*—Leydig, Voit & Mayer

[57] ABSTRACT

In a method of making a semiconductor device, a p-type compound semiconductor layer containing zinc as a dopant impurity and including at least one transition metal element selected from the group consisting of Fe, V, Cr, Mn, Co, and Ni is grown on a second semiconductor layer, the at least one transition metal element inhibiting zinc from diffusing into the second semiconductor layer. A method of making a semiconductor laser includes growing the p-type compound semiconductor layer containing zinc as a cladding layer and the second layer is an undoped compound semiconductor active layer.

14 Claims, 6 Drawing Sheets

METHOD FOR MAKING A SEMICONDUCTOR DEVICE

FIELD OF THE INVENTION

The present invention concerns a compound semiconductor device including a p-type layer doped with zinc and an adjacent layer and inhibiting the diffusion of zinc into the adjacent layer. The invention also concerns a method of making the structure including the zinc-doped layer and inhibiting the diffusion of zinc. The invention particularly concerns a semiconductor laser including an active layer and a p-type cladding layer adjacent the active layer and containing zinc as a dopant impurity. The invention further concerns the semiconductor laser and a method of making the semiconductor laser in which the diffusion of zinc from the cladding layer into the active layer is inhibited.

BACKGROUND ART

FIGS. 5(a)–5(c) illustrate a method of manufacturing a conventional long wavelength semiconductor laser. As illustrated in FIG. 5(a), there are successively grown on a p-type InP substrate 1 by a method, such as metal organic chemical vapor deposition (MOCVD), a p-type InP cladding layer 2, an undoped InGaAsP active layer 3, and an n-type InP cladding layer 4. The three grown layers form a conventional double heterojunction structure.

As shown in FIG. 5(b), a mask 5 of an electrically insulating film, such as silicon dioxide, is formed on a part of the n-type InP cladding layer 4. The mask 5 is used as an etching mask and the layers 2, 3, and 4 are etched to form a mesa or a ridge. After the formation of the ridge, with the mask 5 still in place, a p-type InP layer 6, an n-type InP layer 7, and a p-type InP layer 8 are successively grown by MOCVD. These layers do not grow on the mask 5 and the resulting structure is as illustrated in FIG. 5(b). The p-n-p-type layers 6, 7, and 8 are a current blocking structure that helps confine current flow between the n-type cladding layer 4 and the p-type cladding layer 2 to the ridge including the undoped active layer 3. The p-type layer 6 contacts the side surfaces of the n-type cladding layer 4, forming a pn junction that blocks current flow other than through the active layer 3.

A completed semiconductor laser is illustrated in FIG. 5(c). The mask 5 is removed and thereafter an n-type InP contact layer 9 is grown by MOCVD on the n-type InP cladding layer 4 and the p-type InP 8, forming a rectifying junction with that p-type InP layer 8. The structure is completed by forming electrodes 10 and 11 on the substrate 1 and the n-type InP contact layer 9, respectively.

Conventionally, in producing the semiconductor laser illustrated in FIG. 5(c), a source of zinc as a dopant impurity is present when growing p-type InP layers and a source of sulfur is present as an n-type dopant impurity when growing n-type layers. Although the gaseous source of zinc is absent when the InGaAsP active layer 3 is grown, the zinc incorporated in the p-type cladding layer 2 can diffuse into the active layer 3 during the growth of the active layer 3, the n-type cladding layer 4, and the layers 6–9, since MOCVD is carried out at an elevated temperature.

To reduce the series resistance of the semiconductor laser, it is desirable to incorporate as much zinc as possible in the p-type InP cladding layer 2. However, as the quantity of zinc dopant impurity in that layer is increased, the quantity of zinc that diffuses into the undoped InGaAsP active layer 3 increases substantially. The presence of zinc in the undoped InGaAsP semiconductor material significantly impairs the optical characteristics of that material and has adverse effects on the characteristics of the semiconductor laser. Thus, it has been impossible to reduce the resistance of the laser by reducing the resistivity of the p-type InP cladding layer 2 without causing significant adverse consequences to the optical performance of the semiconductor laser.

SUMMARY OF THE INVENTION

It is an object of the invention to provide a semiconductor device structure including a p-type compound semiconductor layer containing zinc as a dopant impurity and an adjacent compound semiconductor layer in which diffusion of zinc into the adjacent layer is inhibited.

It is another object of the invention to provide a method of making a semiconductor device structure including a p-type compound semiconductor layer containing zinc as a dopant impurity and an adjacent compound semiconductor layer in which diffusion of zinc into the adjacent layer is inhibited.

It is a further object of the invention to provide a semiconductor laser employing a p-type InP cladding layer containing zinc as a dopant impurity and an adjacent undoped InGaAsP active layer in which the diffusion of zinc into the undoped InGaAsP active layer is inhibited.

It is yet another object of the invention to provide a method of making a semiconductor laser including a p-type InP cladding layer containing zinc as a dopant impurity and an undoped InGaAsP active layer in which the diffusion of zinc into the undoped InGaAsP active layer is prevented.

In a semiconductor device structure according to the invention, a p-type compound semiconductor layer contains zinc as a dopant impurity and a second semiconductor layer contacting the p-type compound semiconductor layer wherein the p-type compound semiconductor layer contains at least one transition metal element selected from the group consisting of Fe, V, Cr, Mn, Co, and Ni for inhibiting the diffusion of zinc into the second semiconductor layer.

In a semiconductor laser according to the invention, a p-type compound semiconductor cladding layer contains zinc as a dopant impurity and a compound semiconductor active layer contacts the p-type cladding layer wherein the p-type cladding layer contains at least one transition metal element selected from the group consisting of Fe, V, Cr, Mn, Co, and Ni for inhibiting the diffusion of zinc into the active layer.

A semiconductor laser according to the invention comprises a compound semiconductor substrate, a double heterojunction structure disposed on the substrate and including a p-type compound semiconductor cladding layer, an undoped compound semiconductor active layer disposed on the p-type cladding layer, and an n-type compound semiconductor cladding layer disposed on the active layer, the double heterojunction structure having a ridge structure having opposed sides and a length in a resonator direction of the semiconductor laser and the p-type cladding layer including zinc as a dopant impurity and at least one transition metal element selected from the group consisting of Fe, V, Cr, Mn, Co, and Ni for inhibiting diffusion of zinc from the p-type cladding layer into the active layer; a current blocking structure disposed on one of the cladding layers and contacting both sides of the ridge structure; a compound semiconductor contact layer disposed on the cladding layer opposite the substrate and the current blocking structure; and a first electrode in electrical contact with the p-type cladding layer and a second electrode in electrical contact with the n-type cladding layer.

A method of making a semiconductor device according to the invention includes growing a p-type compound semiconductor layer containing zinc as a dopant impurity and including at least one transition metal element selected from the group consisting of Fe, V, Cr, Mn, Co, and Ni and contacting a second semiconductor layer, the at least one transition metal element inhibiting zinc from diffusing into the second semiconductor layer.

A method of making a semiconductor laser according to the invention includes growing a p-type semiconductor cladding layer containing zinc as a dopant impurity and including at least one transition metal element selected from the group consisting of Fe, V, Cr, Mn, Co, and Ni and contacting an undoped compound semiconductor active, the at least one transition metal element inhibiting the diffusion of zinc from the p-type cladding layer into the active layer.

A method of making a semiconductor laser according to the invention comprises growing on a compound semiconductor substrate a double heterojunction structure including p-type compound semiconductor cladding layer containing zinc as a dopant impurity and including at least one transition element consisting from the group consisting of Fe, V, Cr, Mn, Co, and Ni for preventing diffusion of zinc from the p-type cladding layer, an undoped compound semiconductor active layer, and an n-type cladding layer; masking a portion of the second grown cladding layer and etching portions of the cladding layers and the active layer to produce a ridge structure; growing current blocking layers on the cladding layer closer to the substrate at opposite sides of the ridge structure for concentrating current flow between the p-type and n-type cladding layers through the active layer; removing the etching mask and growing a contact layer contacting the cladding layer opposite the substrate and on the current blocking layers; and forming first and second electrodes respectively in electrical contact with the p-type cladding layer and the n-type cladding layer.

Other objects and advantages of the present invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

FIGS. 1(a)–1(e) are cross-sectional views illustrating steps in a process of making a semiconductor laser according to the invention in which FIG. 1(e) is an embodiment of a semiconductor laser according to the invention.

In all figures, the same elements are given the same reference numbers.

DETAILED DESCRIPTION OF PREFERRED EMBODIMENTS

Figure 1A:
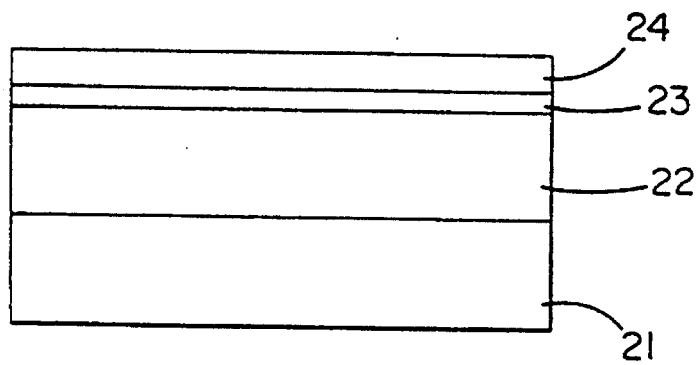
Figure 1B:
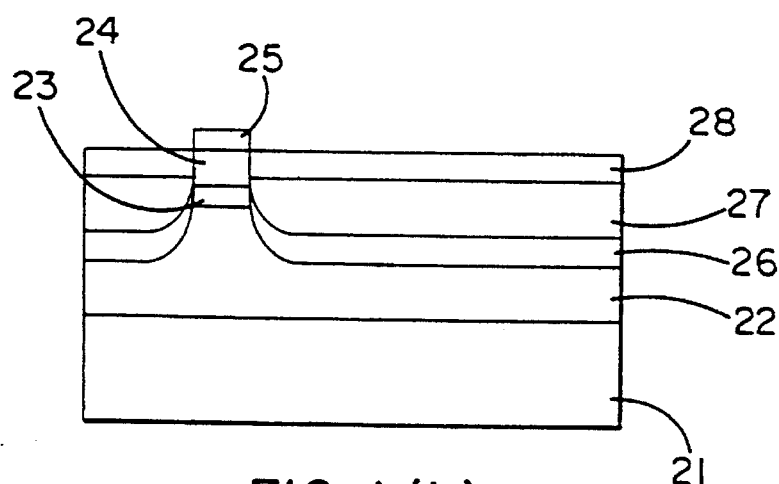
Figure 1C:
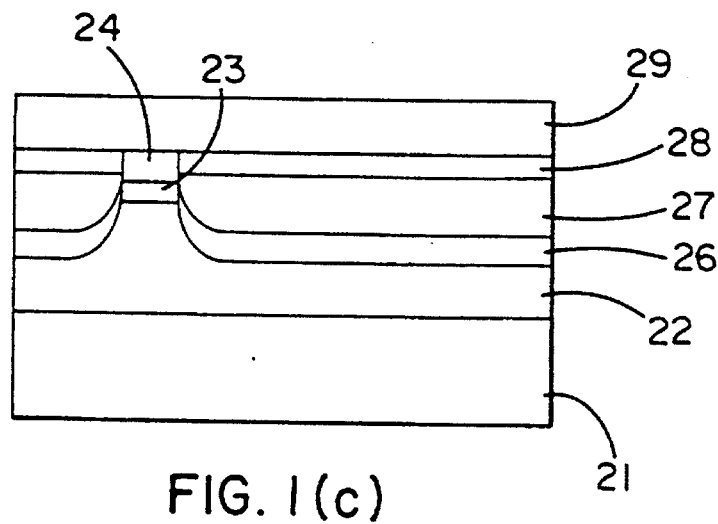
Figure 1D:
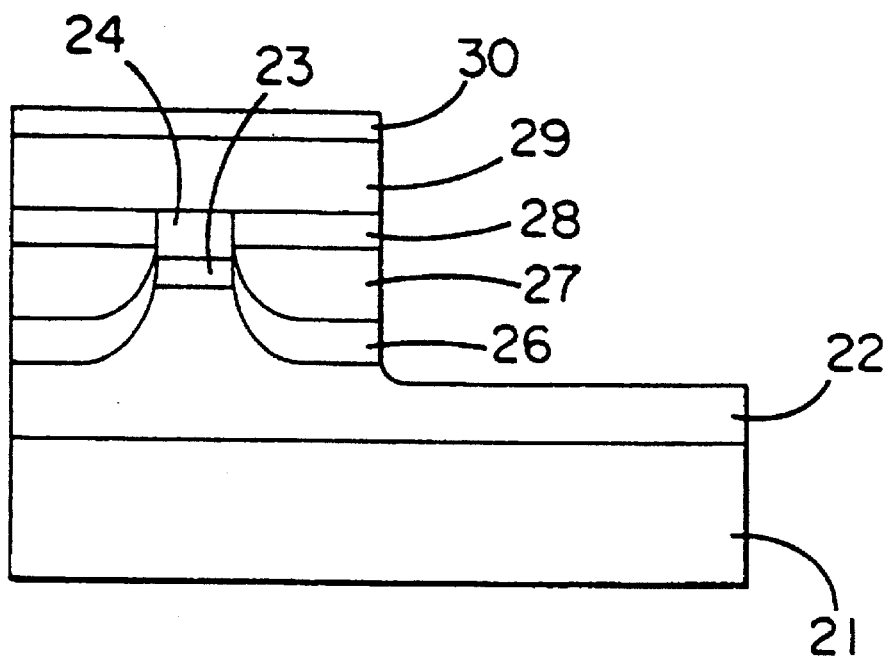
Figure 1E:
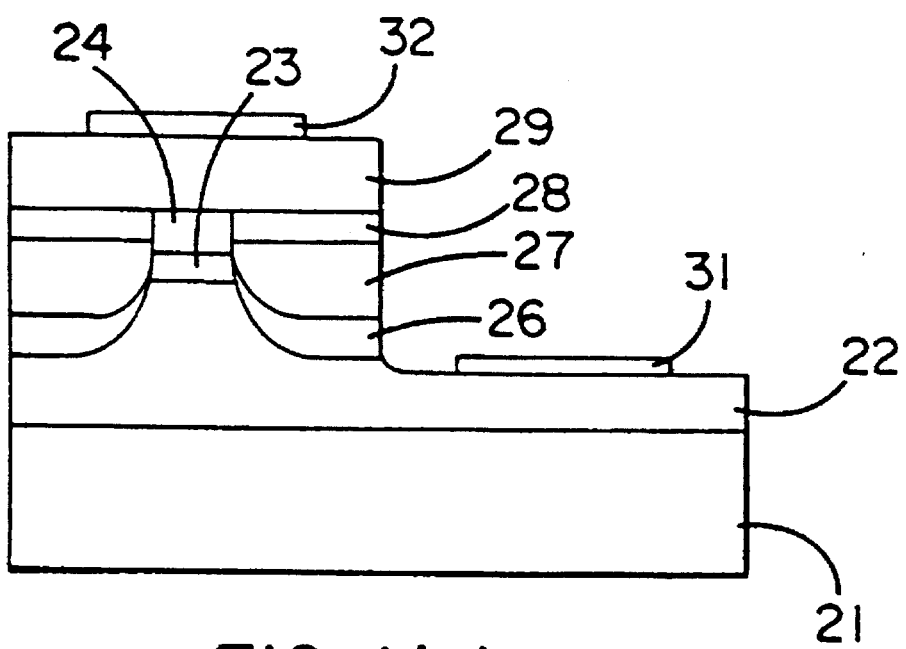

FIGS. 1(a)–1(e) illustrate a method of making a semiconductor laser according to an embodiment of the invention. In FIG. 1(e), a semiconductor laser according to an embodiment of the invention is illustrated in a cross-sectional view.

As shown in FIG. 1(a), initially there are successively grown on an InP substrate 21 containing iron as a dopant impurity a p-type InP cladding layer 22, an undoped InGaAsP active layer 23, and an n-type InP cladding layer 24 to form a double heterojunction structure. These layers are preferably grown by MOCVD using the same conditions as in the preparation of corresponding layers in the conventional semiconductor laser already described. The dopant impurities producing the p-type conductivity type in layer 22 and n-type conductivity type in layer 24 are zinc and sulfur, respectively. Although the active layer 23 is described as a homogeneous InGaAsP layer, that layer may also be a multiquantum well structure.

As illustrated in FIG. 1(b), an etching mask 25, for example, a silicon dioxide film, is formed on a part of the n-type cladding layer 24 and used as an etching mask. As described below, to aid in making contact to the p-type cladding layer 22, the mask 25 is offset with respect to the center of the structure illustrated in FIG. 1(a). As in the method of making the conventional semiconductor laser, the mask 25 is used as an etching mask in a step in which parts of the p-type cladding layer 22, the active layer 23, and the n-type cladding layer 24 are etched and removed, leaving a ridge structure. Thereafter, in a second MOCVD growth step with the mask 25 still in place, there are successively grown a p-type InP layer 26, an n-type InP layer 27, and a p-type InP layer 28 at opposite sides of and burying the ridge structure. As in the conventional semiconductor laser, those p-n-p layers provide a current blocking structure for confining the flow of current between the p-type cladding layer 22 and the n-type cladding layer 24 to the active layer 23 within the ridge structure. The layers 26, 27, and 28 are grown by the same MOCVD process employed in the method of making the prior art semiconductor laser.

After removal of the etching mask 25, as illustrated in FIG. 1(c), an n-type InP contact layer 29 is grown on the n-type InP cladding layer 24 and the p-type InP layer 28 by MOCVD.

Figure 5A:
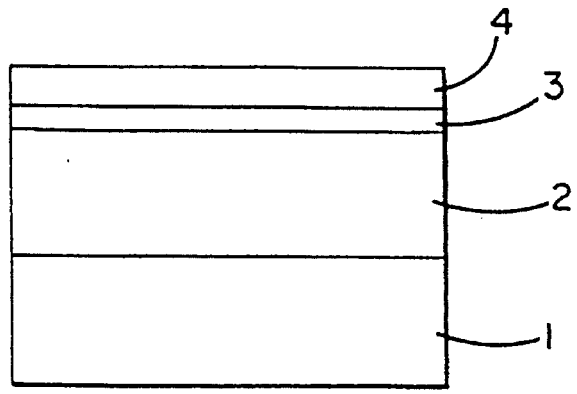
FIGS. 5(a)–5(c) illustrate steps in a method of producing a semiconductor laser according to the prior art.
Figure 5B:
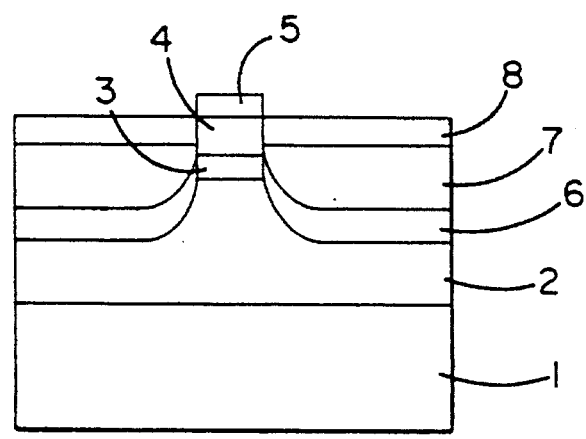
Figure 5C:
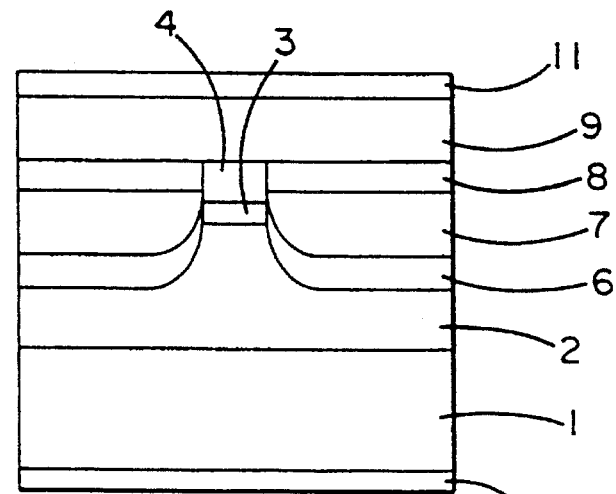

A second etching mask 30 of silicon dioxide or a similar material providing for selective etching is formed on a portion of the n-type InP contact layer 29 opposite the ridge structure and regions on both sides of the ridge structure. That etching mask 30 is employed to protect the ridge structure and adjacent regions as parts of the contact layer 29 and of the current blocking layers 28, 27, and 26 are removed by etching to provide access to the p-type cladding layer 22 for making electrical contact to that layer 22. A part of the layer 22 may be removed in the etching process. The resulting structure is shown in FIG. 1(d). Because the iron-doped InP substrate 21 has a relatively high resistivity attributable to the iron doping, a low resistance electrical contact to the p-type cladding layer 22 cannot be made through the substrate 21 as in the conventional semiconductor laser illustrated in FIG. 5(c).

After removal of the etching mask 30, first and second electrodes 31 and 32 are formed on the p-type cladding layer 22 and the n-type contact layer 29, respectively, as illustrated in FIG. 1(e). Thus, a semiconductor laser embodiment according to the invention is completed. In this structure, although zinc is present as a dopant impurity in the p-type cladding layer 22, iron is also present in that layer because iron diffuses from the substrate 21 into the cladding layer 22 during the MOCVD growth steps illustrated in FIGS. 1(a) and 1(b). The iron atoms, like the zinc dopant atoms in the p-type cladding layer 22, occupy lattice sites in that layer 22 that would be occupied by indium atoms in a perfect crystal. While zinc functions as an acceptor producing the p-type conductivity of the cladding layer 22, the iron atoms function as electron traps, forming a deep energy level within the forbidden zone of the band gap structure of InP. In addition, the iron atoms inhibit the diffusion of zinc from the InP cladding layer 22 into the InGaAsP active layer 23.

Figure 2A:
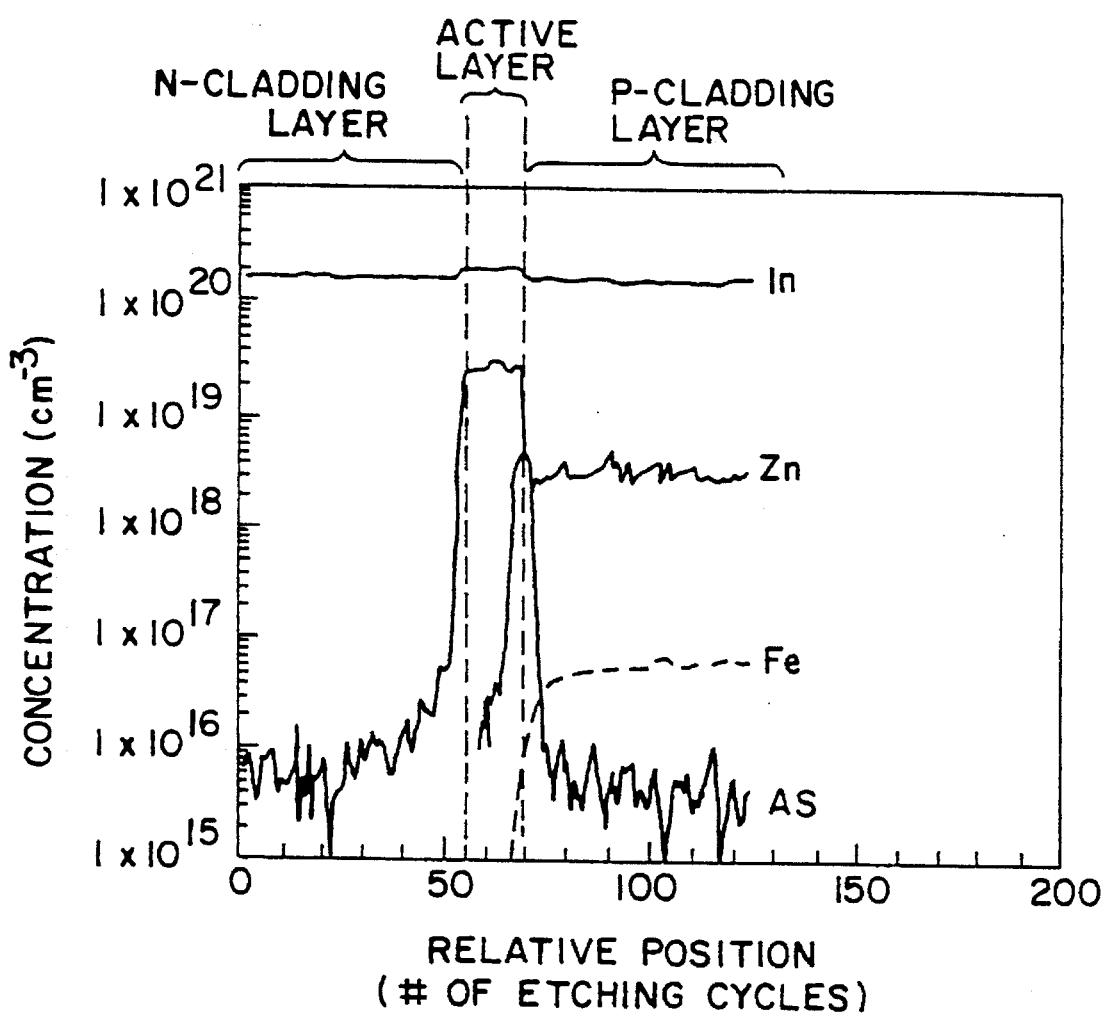
FIGS. 2(a) and 2(b) are graphs of secondary-ion mass spectrometry (SIMS) measurements illustrating the concentration of various atoms within layers of a semiconductor laser according to an embodiment of the invention and the prior art, respectively.
Figure 2B:
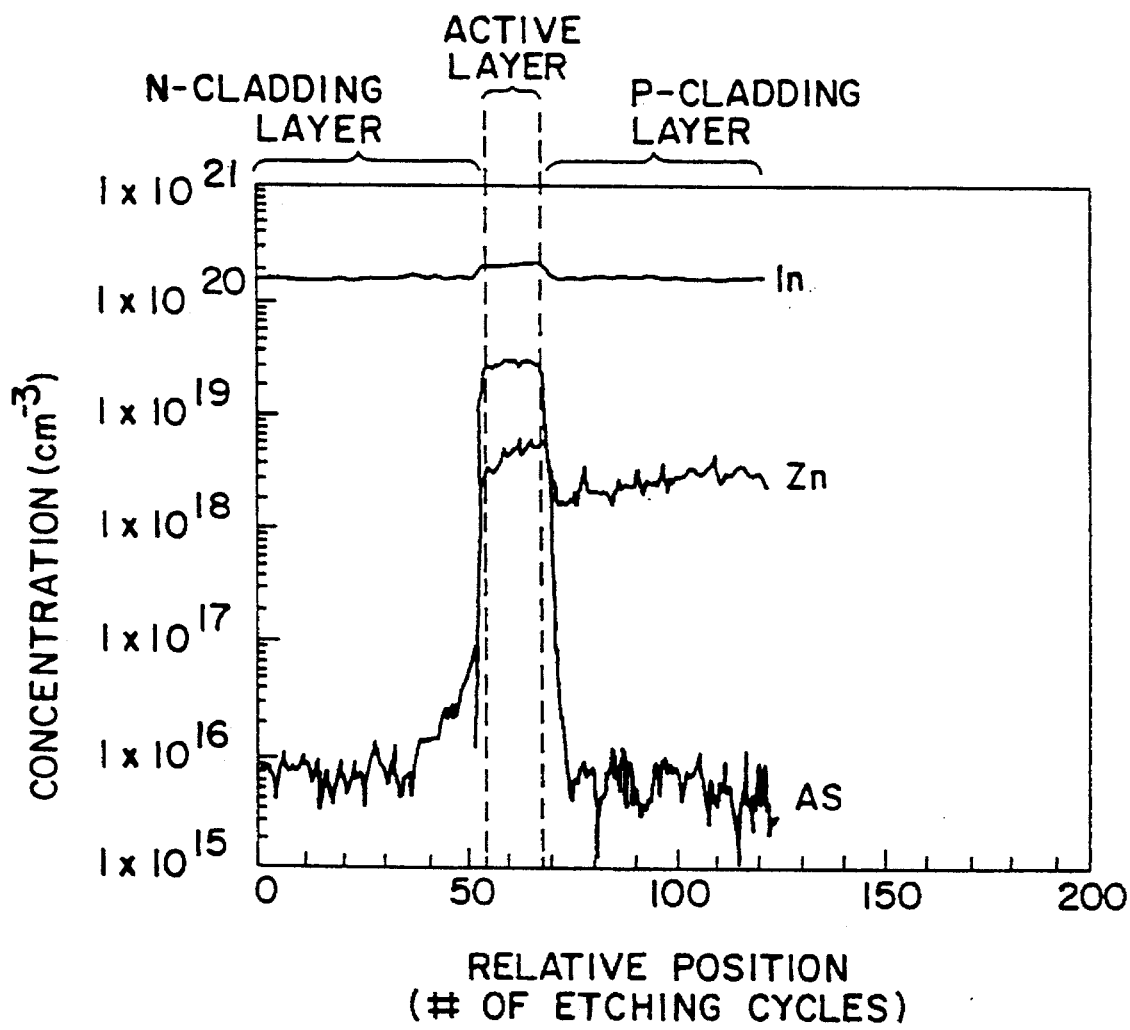

The effectiveness of iron in preventing the diffusion of zinc from the cladding layer 22 into the active layer 23 has been proven through the use of SIMS measurements of laser structures according to the invention and the prior art. FIG. 2(a) is a graph of SIMS measurement results for a laser structure according to the invention and FIG. 2(b) is a graph of SIMS measurement results for a laser structure according to the prior art. In each of these measurements, very thin layers of material are successively removed from the respective laser structures in a dry etching process and the relative indium, zinc, iron, and arsenic content of the surface exposed by each etching step is measured using the SIMS technique. Those atomic concentration measurements provide a compositional profile of the structure. In each of FIGS. 2(a) and 2(b), the abscissa indicates the etching cycle and, thereby, relative position within the laser structure as each etching cycle gradually exposes surfaces starting from the n-type cladding layer and extending through that cladding layer, through the active layer, and into the p-type cladding layer. The ordinate in both of FIGS. 2(a) and 2(b) indicates the concentration of the respective atoms.

In FIG. 2(b), it is apparent that the zinc dopant impurity in the p-type cladding layer has diffused entirely through the active layer to the n-type cladding layer. The zinc dopant impurity concentration is relatively high in the p-type cladding layer to reduce the resistance of the laser structure. However, as shown in FIG. 2(b), zinc has accumulated in the active layer to a concentration even higher than the zinc concentration in the p-type cladding layer. By contrast, in the semiconductor laser structure according to the invention illustrated in FIG. 2(a), while there is some zinc diffusion from the p-type cladding layer into the active layer, the zinc does not penetrate entirely through the active layer and the concentration of zinc declines very rapidly in the active layer near the interface with the p-type cladding layer. The iron reaches only a negligible portion of the active layer. Thus, the graphs of FIGS. 2(a) and 2(b) make clear that the iron impurity in the substrate diffuses into the p-type cladding layer and is effective in inhibiting the diffusion of zinc from the p-type cladding layer into the active layer of the semiconductor laser.

Figure 3:
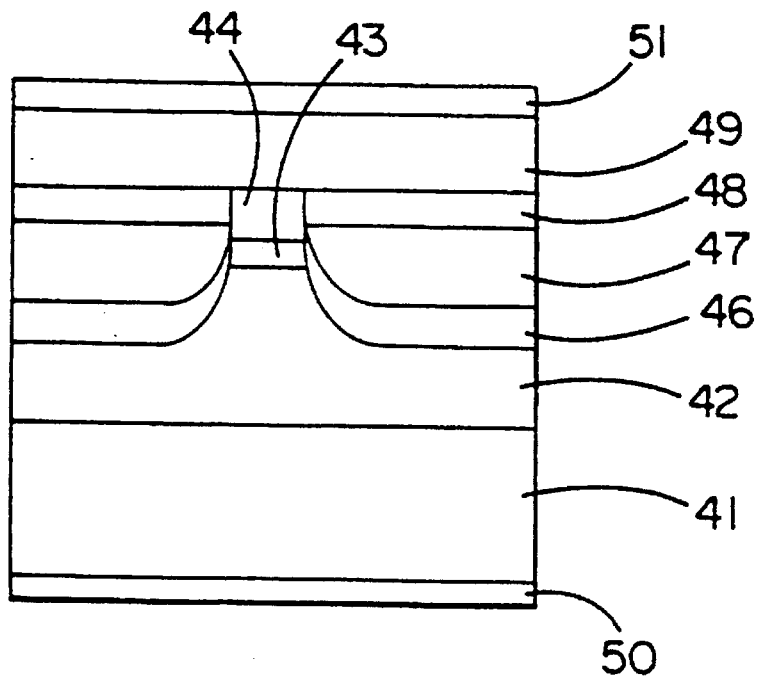
FIG. 3 is a cross-sectional view of a semiconductor laser according to another embodiment of the invention.

FIG. 3 is a cross-sectional view of another semiconductor laser according to an embodiment of the invention. In the structure of FIG. 3, an active layer 43 and an n-type cladding layer 44 respectively correspond to the active layer 23 and the n-type cladding layer 24 of FIG. 1(e). Likewise, current blocking layers 46, 47, and 48 respectively correspond to current blocking layers 26, 27, and 28 of the structure of FIG. 1(e). Contact layer 49 corresponds to the contact layer 29 of the structure of FIG. 1(e). Electrode 51 contacts the layer 49 and corresponds to the electrode 32 of the structure of FIG. 1(e). The structure of FIG. 3 differs from the structure of FIG. 1(e) because, in FIG. 3, an electrode 50 makes direct contact to an InP substrate 41 that is contacted by the p-type cladding layer 42 rather than directly contacting the p-type cladding layer, as in the structure of FIG. 1(e).

In the structure of FIG. 3, the p-type InP substrate 41 does not include iron or another element intended to inhibit the diffusion of zinc from the p-type cladding layer 42. Instead, iron is supplied to the p-type cladding layer 42 during its growth. As in a conventional MOCVD process for growing in a p-type InP layer, zinc is supplied in a gaseous form during the growth of the p-type cladding layer. For example, the zinc source may be diethyl zinc. Iron is incorporated into the p-type cladding layer 42 of FIG. 3 during its growth by also supplying iron in a gaseous form, such as ferrocene $Fe(C_5H_5)_2$. The remainder of the process steps employed in making the semiconductor laser structure of FIG. 3 are the same as those described with respect to the conventional semiconductor laser. However, since iron is not present in the InP substrate 41, the substrate does not have a high resistivity and an electrical contact, the electrode 50, can be made directly to the substrate 41. Since iron is advantageously present in the p-type cladding layer 42, the diffusion of zinc from that layer 42 into the active layer 43 is inhibited. The same result can be achieved by using an n-type substrate in place of the p-type substrate 41.

Figure 4:
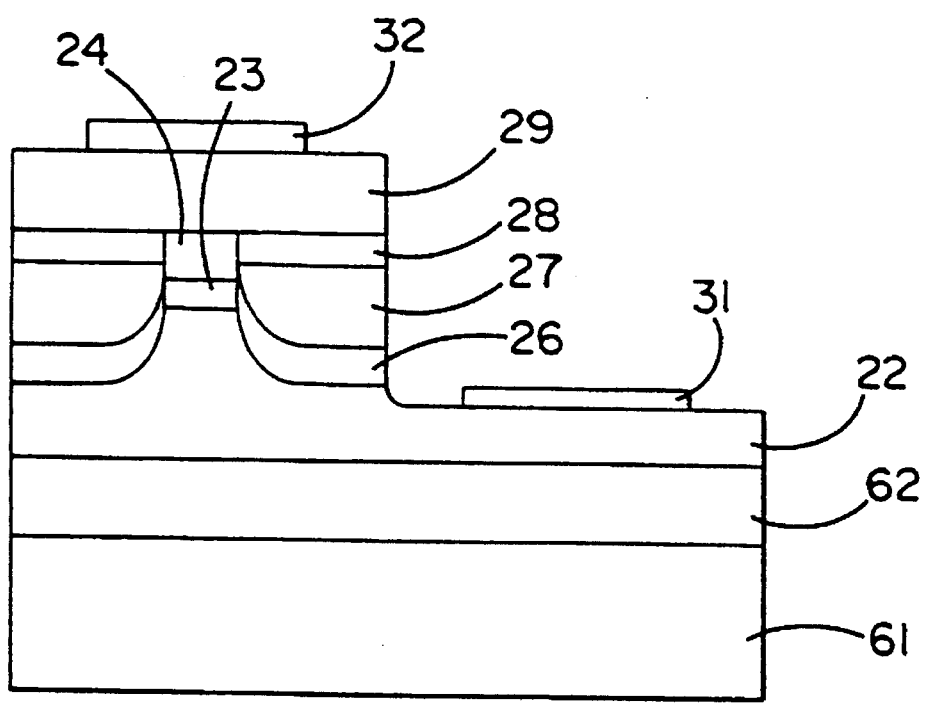
FIG. 4 is a cross-sectional view of a semiconductor laser according to yet another embodiment of the invention.

Still another embodiment of the invention is illustrated in a cross-sectional view in FIG. 4 of the application. The structure of FIG. 4 is similar to the structure of FIG. 1(e) with the exception of the substrate 61 and the buffer layer 62. Since, in this and other figures in the application, all similar elements are given like reference numbers and, therefore, it is only necessary to describe FIG. 4 with respect to the substrate 61 and the buffer layer 62. In this embodiment, the substrate 61 is an n-type or p-type InP substrate on which an InP layer 62 is grown by MOCVD while supplying a gaseous source of iron, such as ferrocene. Thus, the InP layer 62 incorporates iron that diffuses into the p-type cladding layer 22 during its growth, providing the species that inhibits the diffusion of zinc, the p-type dopant in the p-type cladding layer 22, from diffusing into the active layer 23.

Although the invention has been described with respect to the use of iron as inhibiting the diffusion of zinc from a p-type InP cladding layer into an undoped active layer, other transition metal elements that occupy Group III lattice sites in indium phosphide and function as electron traps by providing a deep energy level can be used. Examples of such transition metal elements that can be used individually or in combination with each other or with iron are vanadium (V), chromium (Cr), manganese (Mn), cobalt (Co), and nickel (Ni).

The specific embodiments of semiconductor lasers described above employ indium phosphide and indium gallium arsenide phosphide in order to produce relatively long wavelength light. However, the problem with zinc diffusion from a p-type cladding layer into an adjacent active layer occurs in semiconductor lasers producing various ranges of light wavelengths, including visible light. In those semiconductor lasers, as well as the long wavelength light laser described, iron and/or one or more of the other transition elements mentioned above may be used in a zinc-doped cladding layer to inhibit zinc from diffusing into a contiguous active layer.

The invention has been described with respect to semiconductor lasers and p-type cladding and undoped active layers in those lasers. However, the invention is generally applicable to any compound semiconductor device in which a p-type layer containing zinc is in contact with another semiconductor layer and in which it is desired to inhibit the diffusion of zinc into the other layer. As described, the zinc-doped compound semiconductor may contain iron and/or one or more of the other transition metals mentioned above to inhibit zinc diffusion.

The invention has been described with respect to embodiments in which a p-type compound semiconductor layer containing zinc as a dopant impurity is grown on a substrate and a compound semiconductor into which zinc diffusion is to be inhibited is subsequently grown. However, the invention may be applied to any method or device structure regardless of the sequence or position of the p-type layer containing zinc. For example, a semiconductor laser including an n-type substrate, an n-type cladding layer, an active layer, and a p-type cladding layer including zinc in which the p-type cladding layer is grown after the growth of the active layer falls within the scope of the invention.

The invention has been described with respect to certain preferred embodiments. Various modifications and additions within the spirit of the invention will occur to those of skill in the art. Accordingly, the scope of the invention is limited solely by the following claims.

We claim:

1. In a method of making a semiconductor device, growing a p-type compound semiconductor layer containing zinc as a dopant impurity and including at least one transition metal element selected from the group consisting of Fe, V, Cr, Mn, Co, and Ni and contacting a second semiconductor layer on the p-type compound semiconductor layer, the at least one transition metal element inhibiting zinc from diffusing into the second semiconductor layer.

2. In the method of claim 1, simultaneously supplying a source of zinc and a source of the at least one transition metal element during growth of the p-type layer.

3. In the method of claim 1, growing the p-type layer on a compound semiconductor containing the at least one transition metal element, thereby incorporating the at least one transition metal element in the growing p-type layer by diffusion.

4. In a method of making a semiconductor laser, growing a p-type semiconductor cladding layer containing zinc as a dopant impurity and including at least one transition metal element selected from the group consisting of Fe, V, Cr, Mn, Co, and Ni and contacting an undoped compound semiconductor active layer, the at least one transition metal element inhibiting the diffusion of zinc from the p-type cladding layer into the active layer.

5. In the method of claim 4, simultaneously supplying a source of zinc and a source of the at least one transition metal element during growth of the p-type cladding layer.

6. In the method of claim 5, growing the p-type cladding layer on a compound semiconductor containing the at least one transition metal element, thereby incorporating the at least one transition metal element in the growing p-type cladding layer by diffusion.

7. In the method of claim 5, growing InP as the cladding layer and InGaAsP as the active layer wherein the least one transition metal element is Fe.

8. A method of making a semiconductor laser comprising:

growing on a compound semiconductor substrate a double heterojunction structure including a p-type compound semiconductor cladding layer containing zinc as a dopant impurity and including at least one transition element consisting from the group consisting of Fe, V, Cr, Mn, Co, and Ni for preventing diffusion of zinc from the p-type cladding layer, an undoped compound semiconductor active layer, and an n-type cladding layer;

masking a portion of the n-type cladding layer and etching portions of the cladding layers and the active layer to produce a ridge structure;

growing current blocking layers on the cladding layer closer to the substrate at opposite sides of the ridge structure for concentrating current flow between the p-type and n-type cladding layers through the active layer;

removing the etching mask and growing an n-type contact layer contacting the cladding layer opposite the substrate and on the current blocking layers; and forming first and second electrodes respectively in electrical contact with the p-type cladding layer and the n-type cladding layer.

9. The method of claim 8 wherein the substrate includes the at least one transition metal element and including growing the p-type cladding layer directly on the substrate, thereby incorporating the at least one transition metal element in the p-type cladding layer by diffusion from the substrate.

10. The method of claim 8 wherein the p-type cladding layer contacts the substrate and including, after growing the contact layer, forming a second etching mask on the contact layer opposite the ridge structure and removing portions of the current blocking layers to expose the p-type cladding layer and forming the first electrode in direct contact with the p-type cladding layer.

11. The method of claim 8 including incorporating the at least one transition metal element in the p-type cladding layer by supplying a source of the at least one transition metal element during growth of the p-type cladding layer.

12. The method of claim 11 wherein the p-type cladding layer is InP including supplying ferrocene to the InP p-type cladding layer during growth.

13. The method of claim 8 including growing a buffer layer containing the at least one transition metal element directly on the substrate and subsequently growing the p-type cladding layer directly on the buffer layer, thereby incorporating the at least one transition metal element in the p-type cladding layer by diffusion from the buffer layer.

14. The method of claim 8 including growing InP as the p-type and n-type cladding layers, growing InGaAsP as the active layer, and incorporating Fe, in the p-type cladding layer, as the at least one transition metal element.

* * * * *